United States Patent
Su et al.

(10) Patent No.: US 7,671,645 B2
(45) Date of Patent: Mar. 2, 2010

(54) CHIPSETS AND CLOCK GENERATION METHODS THEREOF

(75) Inventors: Chia-Hung Su, Taipei County (TW); Hung-Yi Kuo, Taipei County (TW)

(73) Assignee: Via Technologies, Inc., Taipei (TW)

( * ) Notice: Subject to any disclaimer, the term of this patent is extended or adjusted under 35 U.S.C. 154(b) by 0 days.

(21) Appl. No.: 12/102,119

(22) Filed: Apr. 14, 2008

(65) Prior Publication Data

US 2009/0121758 A1     May 14, 2009

(30) Foreign Application Priority Data

Nov. 14, 2007   (TW) ............................... 96142998 A

(51) Int. Cl.
*H03L 7/06* (2006.01)
(52) U.S. Cl. ...................... 327/156; 327/158
(58) Field of Classification Search ................ 327/147, 327/149, 156, 158
See application file for complete search history.

(56) References Cited

U.S. PATENT DOCUMENTS

| | | | | |
|---|---|---|---|---|
| 5,646,564 A | * | 7/1997 | Erickson et al. ............. | 327/158 |
| 6,249,189 B1 | * | 6/2001 | Wu et al. ....................... | 331/18 |
| 7,119,630 B1 | * | 10/2006 | Li .............................. | 332/112 |
| 7,126,436 B1 | * | 10/2006 | Li .............................. | 332/127 |
| 7,148,764 B2 | * | 12/2006 | Kasahara et al. ............ | 331/179 |
| 7,307,459 B2 | * | 12/2007 | Starr .......................... | 327/147 |
| 7,532,029 B1 | * | 5/2009 | Asaduzzaman et al. ....... | 326/38 |
| 7,549,073 B2 | * | 6/2009 | Kuo et al. .................. | 713/500 |
| 2006/0283231 A1 | * | 12/2006 | Kuo et al. .................... | 73/1.34 |
| 2008/0197830 A1 | * | 8/2008 | Mehas et al. ................ | 323/318 |
| 2008/0284475 A1 | * | 11/2008 | Lee ............................. | 327/149 |

* cited by examiner

*Primary Examiner*—Lincoln Donovan
*Assistant Examiner*—Adam D Houston
(74) *Attorney, Agent, or Firm*—Thomas, Kayden, Horstemeyer & Risley

(57) ABSTRACT

Chipsets capable of preventing malfunction caused by feedback clock distortion are provided, in which a phase frequency detector generates a control voltage according to a first reference clock and a first feedback clock, a voltage-controlled oscillator generates an output clock according to the control voltage, a frequency divider performs a frequency-division on a second feedback clock to obtain the first feedback clock, and a frequency filter estimates swings and frequency of a third feedback clock from an external unit and selectively outputs one of the third feedback clock or the output clock to serve as the second clock.

20 Claims, 4 Drawing Sheets

CHIPSETS AND CLOCK GENERATION METHODS THEREOF

BACKGROUND OF THE INVENTION

1. Field of the Invention

The invention relates to a chipset, and more particularly, to a chipset capable of preventing malfunction caused by feedback clock distortion and a clock generation method thereof.

2. Description of the Related Art

FIG. 1 shows a conventional clock generation unit, in which a frequency phase detector (FPD) 10 generates a control voltage according to a reference clock SCLK and a clock divided by a frequency divider 14, and a voltage-controlled oscillator (VCO) 12 generates an output clock MCLK according to the control voltage. The frequency divider 14 receives and divides a feedback clock FBCLK from an external circuit, and then outputs the divided clock to the frequency phase detector 10, such that the clock generation unit 100 can adjust the output clock MCLK according to the feedback clock FBCLK. However, when the feedback clock FBCLK is distorted by the external circuit, the clock generation unit 100 improperly adjusts the output clock MCLK, such as improperly increasing the frequency of the output clock MCLK. The improper adjustment causes malfunctions to occur in the electronic elements coupled to the output clock MCLK.

BRIEF SUMMARY OF THE INVENTION

Embodiments of a chipset are provided, in which a phase frequency detector generates a control voltage according to a first reference clock and a first feedback clock, a voltage-controlled oscillator generates an output clock according to the control voltage, a frequency divider performs a frequency-division on a second feedback clock to obtain the first feedback clock, and a frequency filter estimates swings and frequency of a third feedback clock from an external unit and selectively outputs one of the third feedback clock or the output clock to serve as the second clock.

The invention provides an embodiment of a clock generation method, in which a output clock is generated according to a first reference clock and a first feedback clock, a frequency-division is performed on a second feedback clock to obtain the first feedback clock, a third feedback clock from an external unit is received to serve as the second feedback clock, swings and frequency of the third feedback clock is estimated, and the output clock is outputted to serve as the second feedback when numbers of the positive swings and negative swings of the third feedback clock exceeds one.

The invention provides an embodiment of a frequency filter, in which a multiplexer is coupled to an output clock from a clock generator in a chipset and coupled to a first feedback clock from an external unit, and a determining unit detects a frequency of the first feedback clock and numbers of positive and negative swings of the first feedback clock, thereby selectively feeding one of the first feedback clock or the output clock to the clock generator.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 2A:
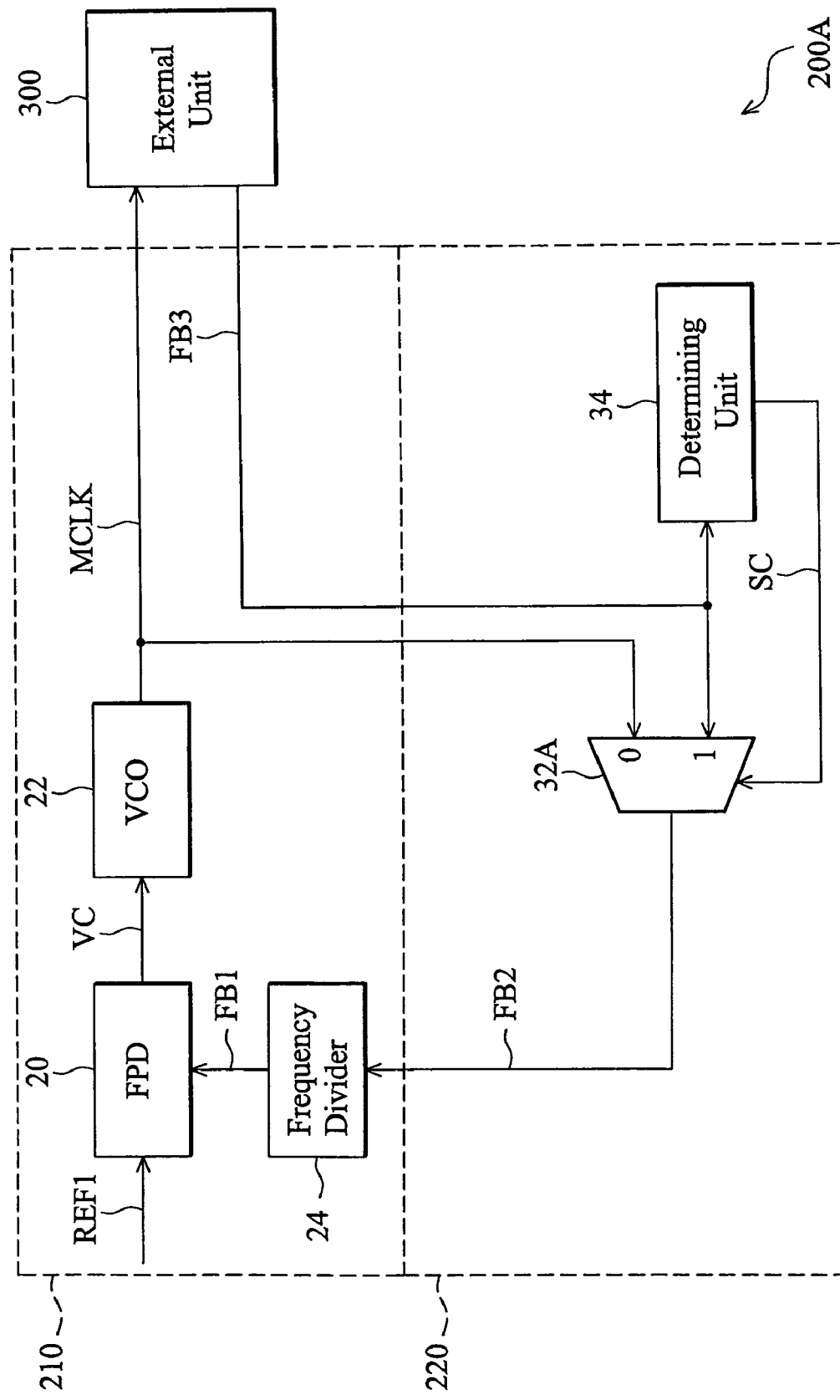
FIG. 2A shows an embodiment of a chipset according to the invention.

FIG. 2A shows an embodiment of a chipset according to the invention. As shown, a chipset 200A generates an output clock MCLK to an external unit 300, and comprises a clock generator 210 to generate the output clock MCLK according to a reference clock REF1, and a frequency filter 220 to selectively feed one of the output clock MCLK or a feedback clock FB3 from the external unit 300 to the clock generator 210. For example, the external unit 300 can be another clock generator or a combination of a clock generator and a buffer, but is not limited thereto.

The clock generator 210 can be a phase locked loop (PLL), but is not limited thereto. The clock generator 210 comprises a frequency phase detector (FPD) 20 to generate a control voltage VC according to the reference clock REF1 and the feedback clock FB1, a voltage-controlled oscillator (VCO) 22 to generate the output clock MCLK according to the control voltage VC, and a frequency divider 24 to perform a frequency division on a feedback clock FB2 to generate the feedback clock FB1.

In order to prevent feeding a distorted clock to the clock generator 210, the frequency filter 220 estimates swings and frequency of the feedback clock FB3 to selectively output one of the feedback clock FB3 or the output clock MCLK to frequency divider 24 to serve as the feedback clock FB2. The frequency filter 220 comprises a multiplexer 32A coupled to the output clock MCLK and the feedback clock FB3, and a determining unit 34, estimating the swings and frequency of the feedback clock FB3 and generating a control signal SC to the multiplexer 32A.

In this embodiment, when a difference between numbers of positive swings and negative swings of the feedback clock FB3 is smaller than one or equals one, and the frequency of the feedback clock FB3 substantially equals a predetermined frequency, the determining unit 34 determines that the feedback clock FB3 is not distorted and outputs a control signal SC with a high voltage level to the multiplexer 32A. Hence, according to the control signal SC with the high voltage level, the multiplexer 32A outputs the feedback clock FB3 from the external unit 300 to serve as the feedback clock FB2 (i.e., the feedback clock FB3 can be regarded as the feedback clock FB2), such that the clock generator 210 adjusts the output clock MCLK according to the feedback clock FB3 from the external unit 300. Namely, the frequency divider 24 performs a frequency division on the feedback clock FB3 to obtain the feedback clock FB1 output to the frequency phase detector 20. Accordingly, the frequency phase detector 20 generates the control voltage VC according to the reference clock REF1 and the feedback clock FB1 which is obtained by frequency-dividing the feedback clock FB3, and the VCO 22 adjusts the output clock MCLK according to the control voltage VC. In this embodiment, the numbers of the positive swings and negative swings can be regarded as the numbers of the rising edges and falling edges of the feedback clock FB3, but is not limited thereto.

On the contrary, when the difference between the numbers of the positive swings and the negative swings of the feedback clock FB3 exceeds one or when the frequency of the feedback clock FB3 is different from the predetermined frequency, the determining unit 34 determines that the feedback clock FB3 is distorted and outputs the control signal SC with a low voltage level to the multiplexer 32A. Thus, the multiplexer 32A outputs the output clock MCLK generated by the VCO 22 to serve as the feedback clock FB2 (i.e., the feedback clock FB2 can be regarded as the output clock MCLK), such that clock generator 210 dose not adjust the output clock MCLK according to the feedback clock FB3. Namely, the frequency divider 24 performs the frequency division on the output clock MCLK to obtain the feedback clock FB1 output to the frequency phase detector 20. Accordingly, the frequency phase detector 20 generates the control voltage VC according to the reference clock REF1 and the feedback clock FB1 which is obtained by frequency-dividing the output clock MCLK, and the VCO 22 adjusts the output clock MCLK according to the control voltage VC.

In addition, the determining unit 34 estimates the swings and frequency of the feedback clock FB3 again after a predetermined time interval. If the feedback clock FB3 is normal (not distorted), i.e., the difference between the numbers of the positive swings and the negative swings is smaller than one or equals one, and the frequency of the feedback clock FB3 substantially equals the predetermined frequency, the determining unit 34 enables the multiplexer 32A to output the feedback clock FB3 to serve as the feedback clock FB2 and then output to the frequency divider 24. If the feedback clock FB3 is still distorted, the determining unit 34 continues to output the control signal SC with the low voltage level, such that the multiplexer 32A maintains output of the output clock MCLK to serve as the feedback clock FB2 and then output to the frequency divider 24.

Figure 1:
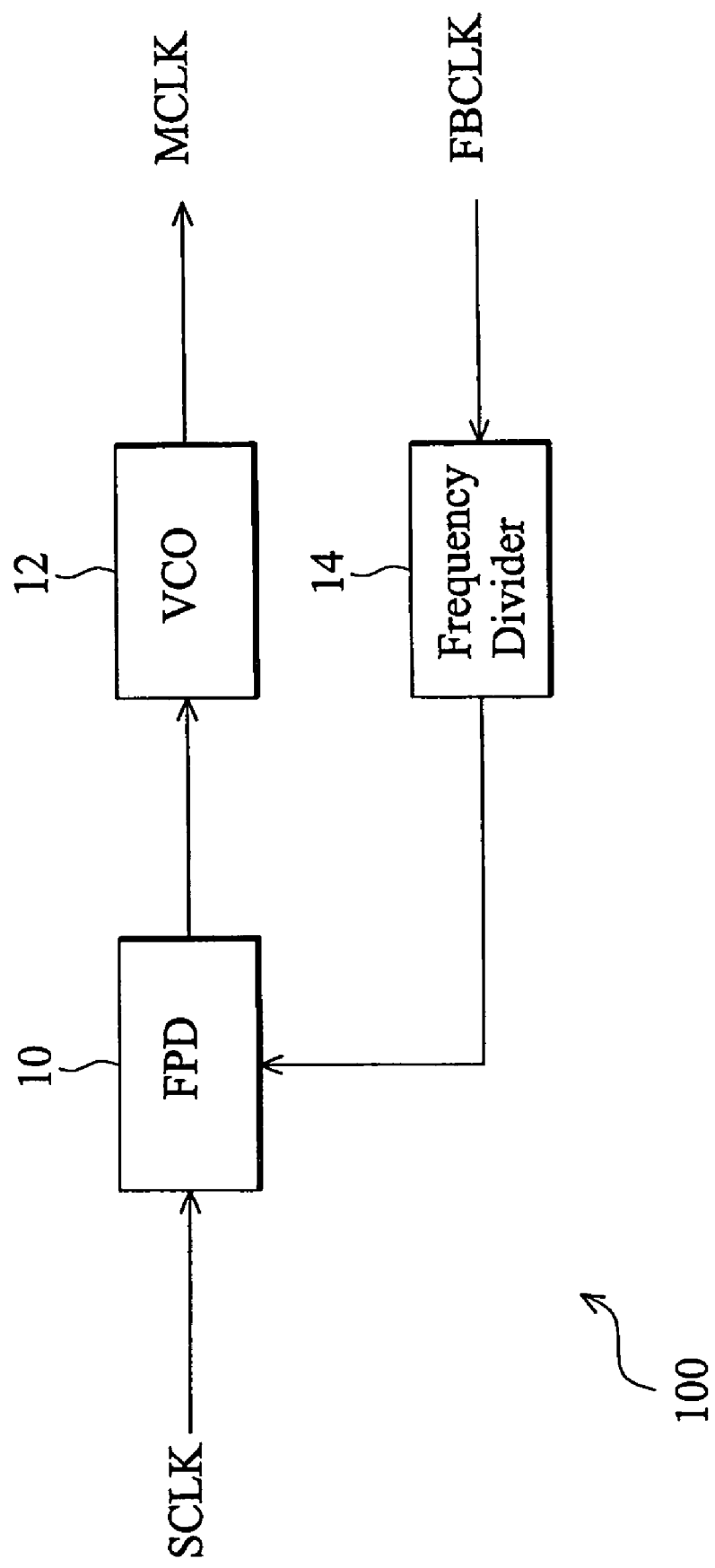
FIG. 1 shows a conventional clock generation unit.
Figure 2B:
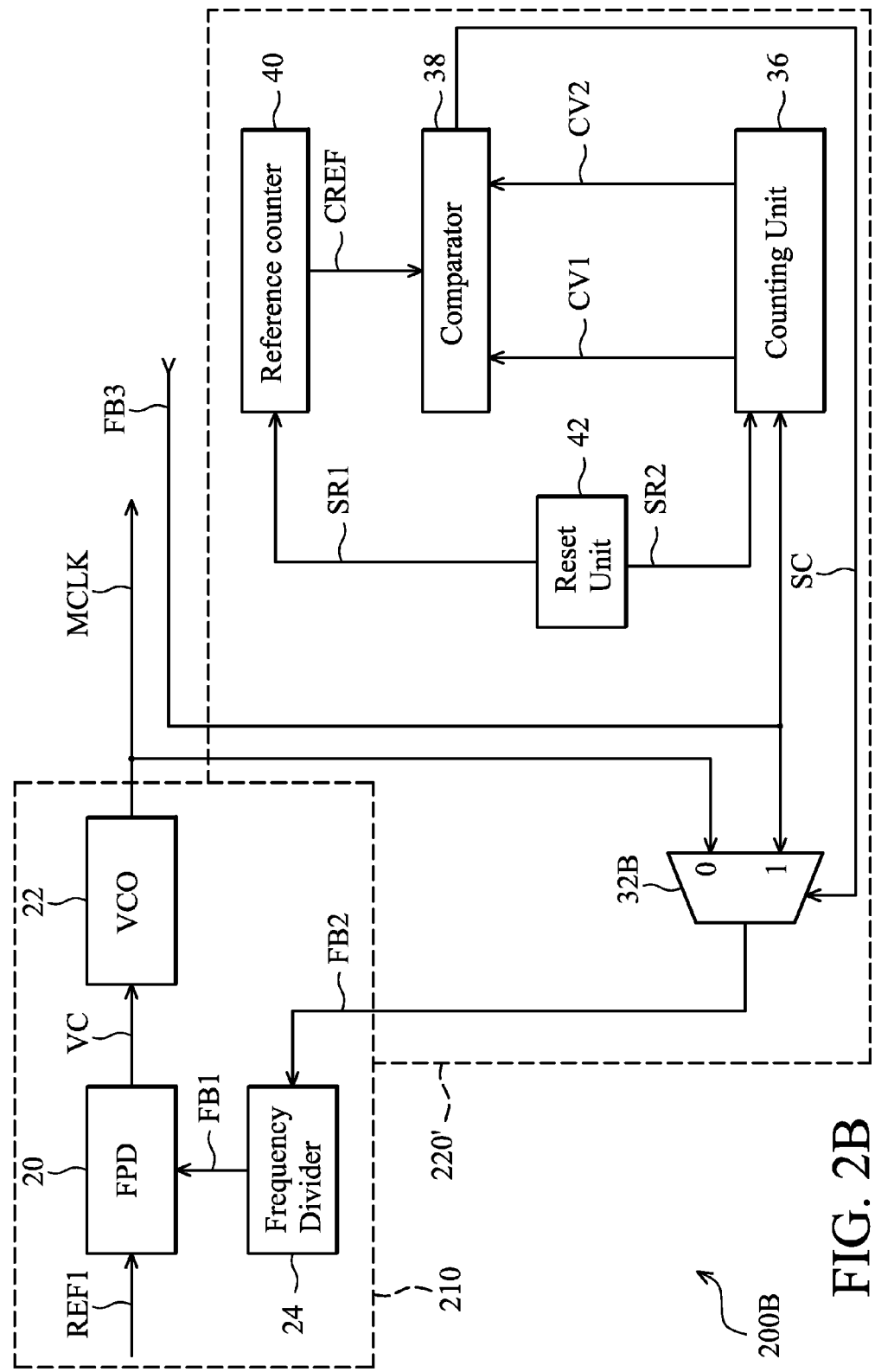
FIG. 2B shows another embodiment of a chipset according to the invention.

FIG. 2B shows another embodiment of a chipset according to the invention. As shown, the chipset 200B is similar to the chipset 200A shown in FIG. 1, except that the frequency filter 220″ comprises a multiplexer 32B, a counting unit 36, a comparator 38, a reference counter 40 and a reset unit 42. For example, the counting unit 36, the comparator 38, the reference counter 40 and the reset unit 42 can be an embodiment of the determining unit 34, but is not limited thereto.

The multiplexer 32B is coupled to the output clock MCLK and the feedback clock FB3 from the external unit 300 (shown in FIG. 2A). The counting unit 36 counts the numbers of the positive and negative swings of the feedback clock FB3, and accordingly generates first and second counting values CV1 and CV2, and the comparator 30 compares the first counting value CV1 with the second counting value CV2.

When a difference between the first and second counting values CV1 and CV2 does not exceed one (i.e., is smaller than one or equals one) and a difference between a predetermined counting value CREF representing a predetermined frequency, and one of the first or second counting values CV1 or CV2 does not exceeds N, it means that the feedback clock FB3 is not distorted. The value of N can be is an integral smaller than two or equals two, for example, but is not limited thereto. Hence, the comparator 38 outputs a control signal SC with a high voltage level such that the multiplexer 32B outputs the feedback clock FB3 to serve as the feedback clock FB2, i.e., the multiplexer 32B feedbacks the feedback clock FB3 to the frequency divider 24.

Also, the comparator 38 compares the first counting value CV1, the second counting value CV2 and the predetermined counting value CREF representing a predetermined frequency. When the difference between the first and second counting values CV1 and CV2 exceeds one, it means that the feedback clock FB3 is distorted. Hence, the comparator 38 outputs the control signal SC with a low voltage level such that the multiplexer 32B outputs the output clock MCLK to serve as the feedback clock FB2, i.e., the multiplexer 32B feedbacks the output clock MCLK to the frequency divider 24.

When the difference between the predetermined counting value CREF representing the predetermined frequency and one of the first or second counting values CV1 or CV2 exceeds two, it means that the frequency of the feedback clock FB3 is different from that of the predetermined frequency. Hence, the comparator 38 outputs the control signal SC with a low voltage level such that the multiplexer 32B outputs the output clock MCLK to serve as the feedback clock FB2, i.e., the multiplexer 32B feedbacks the output clock MCLK to the frequency divider 24. In this embodiment, the counting unit 36 can, for example, be a counter with a Hysteresis comparison function, but is not limited thereto.

In addition, the reset unit 42 generates reset signals SR1 and SR2 to reset (clear) the reference count 40 and counting unit 36 after a predetermined time, thereby again estimating the swings and frequency of the feedback clock FB3. The comparator 38 outputs a control signal SC with a high voltage level such that the multiplexer 32B outputs the feedback clock FB3 to serve as the feedback clock FB2 and feedback to the frequency divider 24, if the feedback clock FB3 is normal (recoveries or is not distorted), i.e., the difference between the numbers of the positive swings and the negative swings of the feedback clock FB3 is smaller than one or equals one, and the frequency of the feedback clock FB3 substantially equals the predetermined frequency. For example, the reset unit 42 can be a watch dog counter, but is not limited thereto.

Figure 2C:
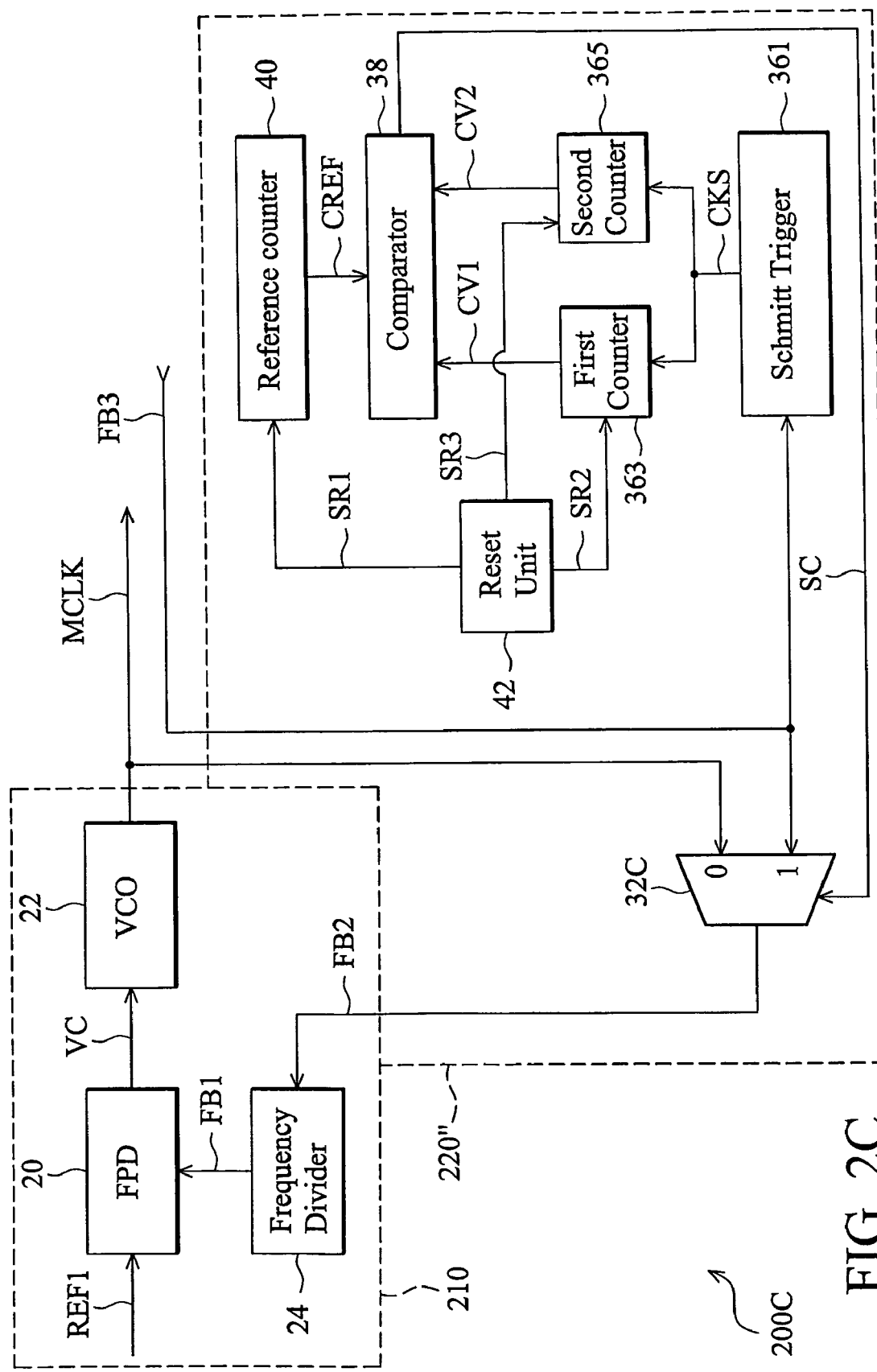
FIG. 2C shows another embodiment of a chipset according to the invention.

FIG. 2C shows another embodiment of the chipset according to the invention. As shown, the chipset 200C is similar to the chipset 200A shown in FIG. 2A, except that the frequency filter 220″ comprises a multiplexer 32C, a Schmitt trigger 361, first and second counters 363 and 365, a comparator 38, a reference counter 40 and a reset unit 42. For example, the multiplexer 32C, the Schmitt trigger 361, the first and second counters 363 and 365, the comparator 38, the reference counter 40 and the reset unit 42 can be regarded as another embodiment of the frequency filter 34 shown in FIG. 2A, but is not limited thereto.

The multiplexer 32C is coupled to the output clock MCLK and the feedback clock FB3 from the external unit 300. The Schmitt trigger 361 receives the feedback clock FB3 and generates a corresponding clock CKS, and the first and the second counters 363 and 365 obtain the numbers of the positive swings and negative swings of the feedback clock FB3 and generate corresponding first and second counting values CV1 and CV2 according to the corresponding clock CKS.

The comparator 38 compares the first counting value CV1 with the second counting value CV2. When the difference between the first and second counting values CV1 and CV2 does not exceed one (i.e., is smaller than one or equals one) and the difference between the predetermined counting value CREF representing the predetermined frequency and one of the first or second counting values CV1 or CV2 does not exceeds 2, it means that the feedback clock FB3 is not distorted. Hence, the comparator 38 outputs the control signal SC with a high voltage level such that the multiplexer 32C outputs the feedback clock FB3 to serve as the feedback clock FB2 and feedback to the frequency divider 24.

On the contrary, when the difference between the first and second counting values CV1 and CV2 exceeds one, it means that the feedback clock FB3 is distorted. Hence, the comparator 38 outputs the control signal SC with a low voltage level such that the multiplexer 32C outputs the output clock MCLK to serve as the feedback clock FB2 and feedback to the frequency divider 24.

In addition, the comparator 38 compares the first counting value CV1, the second counting value CV2 and the predetermined counting value CREF representing a predetermined frequency. When the difference between the predetermined counting value CREF representing the predetermined frequency and one of the first or second counting values CV1 or CV2 exceeds two, it means that the frequency of the feedback clock FB3 is different from that of the predetermined frequency. Hence, the comparator 38 outputs the control signal SC with a low voltage level such that the multiplexer 32C outputs the output clock MCLK to serve as the feedback clock FB2 and feedback to the frequency divider 24.

Moreover, the reset unit 42 generates reset signals SR1~SR3 to reset (clear) the reference count 40 and the first and second counters 363 and 366 after a predetermined time, thereby again estimating the swings and frequency of the feedback clock FB3. The comparator 38 outputs a control signal SC with a high voltage level such that the multiplexer 32C outputs the feedback clock FB3 to serve as the feedback clock FB2 and feedback to the frequency divider 24, if the feedback clock FB3 is normal (recoveries or is not distorted), i.e., the difference between the numbers of the positive swings and the negative swings of the feedback clock FB3 is smaller than one or equals one, and the frequency of the feedback clock FB3 substantially equals the predetermined frequency.

Because the chipset 200A~200C of the invention can stop feeding the feedback clock FB3 back to the clock generator 210 when the feedback clock FB3 from the external unit 300 is distorted, the output clock MCLK is not distorted by a distorted feedback clock FB3.

Certain terms are used throughout the description and claims to refer to particular system components. As one skilled in the art will appreciate, consumer electronic equipment manufacturers may refer to a component by different names. This document does not intend to distinguish between components that differ in name but not function.

Although the invention has been described in terms of preferred embodiment, it is not limited thereto. Those skilled in the art can make various alterations and modifications without departing from the scope and spirit of the invention. Therefore, the scope of the invention shall be defined and protected by the following claims and their equivalents.

What is claimed is:

1. A chipset, comprising:
   a frequency phase detector generating a control voltage according to a first reference clock and a first feedback clock;
   a voltage-controlled oscillator generating an output clock according to the control voltage;
   a frequency divider performing a frequency-division on a second feedback clock to obtain the first feedback clock; and
   a frequency filter estimating swings and frequency of a third feedback clock from an external unit and outputting one of the third feedback clock or the output clock to selectively serve as the second feedback clock.

2. The chipset as claimed in claim 1, wherein the frequency filter outputs the output clock to serve as the second feedback clock when a difference between numbers of positive swings and negative swings of the third feedback clock exceeds one.

3. The chipset as claimed in claim 2, wherein the frequency filter outputs the output clock to serve as the second feedback clock when the frequency of the third feedback clock is different from a predetermined frequency.

4. The chipset as claimed in claim 2, wherein the frequency filter comprises:
   a multiplexer coupled to the output clock and the third feedback clock;
   a counter with a Hysteresis comparison function counting the numbers of the positive swings and negative swings of the third feedback clock to accordingly generate first and second counting values; and
   a comparator comparing the first counting value with the second counting value, and enabling the multiplexer to output the output clock when a difference of the first and second counting values exceeds one.

5. The chipset as claimed in claim 4, wherein the frequency filter further comprises:
   a reference counter generating a predetermined counting value representing a predetermined frequency, wherein the comparator enables the multiplexer to output the output clock when a difference between the predetermined counting value and one of the first or second counting values exceeds N, and N is an integral smaller than two.

6. The chipset as claimed in claim 2, wherein the frequency filter comprises:
   a multiplexer coupled to the output clock and the third feedback clock;
   a Schmitt trigger receiving the third feedback clock and outputting a first clock;
   first and second counters obtaining the numbers of the positive swings and negative swings of the third feedback clock according to the first clock and accordingly generating first and second counting values; and
   a comparator comparing the first counting value with the second counting value, and enabling the multiplexer to output the output clock when a difference of the first and second counting values exceeds one.

7. A clock generation method of a chipset, comprising:
   generating an output clock according to a first reference clock and a first feedback clock;
   performing a frequency-division on a second feedback clock to obtain the first feedback clock;
   receiving a third feedback clock from an external unit to serve as the second feedback clock;
   estimating swings and frequency of the third feedback clock; and
   outputting the output clock to serve as the second feedback when a difference between numbers of the positive swings and negative swings of the third feedback clock exceeds one.

8. The method as claimed in claim 7, further comprising outputting the output clock to serve as the second feedback when a frequency of the third feedback clock is different from a predetermined frequency.

9. The method as claimed in claim 8, further comprising:
   estimating the swings and frequency of the third feedback clock again after a predetermined time interval; and
   using the third feedback clock to serve as the second feedback clock when a difference between the numbers of the positive swings and negative swings of the third feedback clock is smaller than one and the frequency of the third feedback is substantially equal to the predetermined frequency.

10. The method as claimed in claim 7, wherein estimating the swings and frequency of the third feedback clock comprising:

counting the numbers of the positive swings and negative swings of the third feedback clock by a counter with a Hysteresis comparison function to accordingly generate first and second counting values;

comparing the first counting value with the second counting value; and using the output clock to serve as the second feedback clock when a difference between the first and second counting values exceeds one.

11. The method as claimed in claim 10, wherein estimating the swings and frequency of the third feedback clock further comprises:

comparing one of the first or second counting values with a predetermined counting value representing a predetermined frequency; and using the output clock to serve as the second feedback clock when a difference between the predetermined counting value and one of the first or the second counting values exceeds N, in which N is an integral smaller than two.

12. The method as claimed in claim 7, wherein generating the output clock comprises:

generating a control voltage according to the first feedback clock and the first reference clock; and generating the output clock according to the control voltage.

13. A frequency filter, comprising:

a multiplexer coupled to an output clock from a clock generator in a chipset and a first feedback clock from an external unit; and a determining unit detecting a frequency of the first feedback clock and numbers of positive and negative swings of the first feedback clock, thereby selectively feeding one of the first feedback clock or the output clock to the clock generator.

14. The frequency filter as claimed in claim 13, wherein the determining unit enables the multiplexer to outputs the output clock to the clock generator when a difference between the numbers of the positive and second swings of the first feedback clock exceeds one.

15. The frequency filter as claimed in claim 14, wherein the determining unit enables the multiplexer to outputs the output clock to the clock generator when the frequency of the first feedback clock is different from a predetermined frequency.

16. The frequency filter as claimed in claim 15, wherein the determining unit detects a frequency of the first feedback clock and numbers of positive and negative swings of the first feedback clock at every predetermined time interval, and enables the multiplexer to output the first feedback clock to the clock generator when the difference between the numbers of the positive and second swings of the first feedback clock does not exceed one and the frequency of the first feedback clock is substantially equal to the predetermined frequency.

17. The frequency filter as claimed in claim 16, wherein the determining unit comprises:

a counting unit counting the numbers of the positive swings and negative swings of the first feedback clock to accordingly generate first and second counting values; and a comparator comparing the first counting value with the second counting value, and enabling the multiplexer to output the output clock to the clock generator instead of the first feedback clock, when the difference between the first and second counting values exceeds one.

18. The frequency filter as claimed in claim 17, further comprising a reference counter generating a predetermined counting value representing the predetermining frequency, in which the comparator enables the multiplexer to output the output clock to the clock generator instead of outputting the first feedback clock to the clock generator, when a difference between the predetermined counting value and one of the first or second counting values exceeds N, and N is an integral smaller than two.

19. The frequency filter as claimed in claim 18, wherein the comparator enables the multiplexer to output the first feedback clock to the clock generator instead of outputting the output clock to the clock generator, when a difference between any two of the first and second counting values and the predetermined counting value is smaller than one or equals one.

20. The frequency filter as claimed in claim 16, wherein the determining unit comprises:

a Schmitt trigger receiving the first feedback clock and outputting a first clock;

first and second counters counting the numbers of the positive swings and negative swings of the first feedback clock according to the first clock and accordingly generating first and second counting values; and a comparator comparing the first counting value with the second counting value, and enabling the multiplexer to output the output clock to the clock generator instead of outputting the first feedback clock to the clock generator, when a difference of the first and second counting values exceeds one.

* * * * *